(12) United States Patent
Kasturi et al.

(10) Patent No.: US 10,119,999 B2
(45) Date of Patent: Nov. 6, 2018

(54) CIRCUIT CONNECTIVITY AND CONVEYANCE OF POWER STATUS INFORMATION

(71) Applicant: International Rectifier Corporation, El Segundo, CA (US)

(72) Inventors: Prasan Kasturi, Sharon, MA (US); Rakesh Renganathan, Warwick, RI (US); Danny Clavette, Greene, RI (US); Rong Guo, North Kingstown, RI (US)

(73) Assignee: Infineon Technologies Americas Corp., El Segundo, CA (US)

( * ) Notice: Subject to any disclaimer, the term of this patent is extended or adjusted under 35 U.S.C. 154(b) by 770 days.

(21) Appl. No.: 14/556,536

(22) Filed: Dec. 1, 2014

(65) Prior Publication Data

US 2016/0154037 A1    Jun. 2, 2016

(51) Int. Cl.
*G01R 31/28* (2006.01)
*G01R 19/165* (2006.01)
*G01R 19/00* (2006.01)
*H02M 3/158* (2006.01)

(52) U.S. Cl.
CPC ... *G01R 19/16538* (2013.01); *G01R 19/0084* (2013.01); *H02M 3/158* (2013.01)

(58) Field of Classification Search
CPC .................. G01R 19/16538; G01R 19/0084
See application file for complete search history.

(56) References Cited

U.S. PATENT DOCUMENTS 9,461,562 B1 * 10/2016 Johal ................... H02M 7/00
9,720,477 B2 * 8/2017 Gefen ................... G06F 1/28

* cited by examiner

*Primary Examiner* — Tung X Nguyen
(74) *Attorney, Agent, or Firm* — Chapin IP Law, LLC

(57) ABSTRACT

An example system comprises first circuitry (such as a first integrated circuit device having a limited number of input/output pins) and second circuitry (such as a second integrated circuit device having a limited number of input output pins). The second circuitry is communicatively coupled to receive communications over a communication link from the first circuitry. In one embodiment, the first circuitry includes a monitor circuit. The monitor circuit monitors a voltage rail inputted to power the first circuitry. The monitor circuit initiates switching between transmitting a control signal (such as status information indicating whether the first circuitry is powered correctly) and a data signal over a communication link from the first circuitry to second circuitry depending upon the magnitude of the voltage rail. For example, when the first circuit is properly powered, the monitor circuit initiates transmission of the data signal over the communication link to the second circuitry.

29 Claims, 8 Drawing Sheets

CIRCUIT CONNECTIVITY AND CONVEYANCE OF POWER STATUS INFORMATION

BACKGROUND

In multi-circuit applications powered by multiple voltage rails, it is sometimes necessary to guarantee that the power sequencing is maintained between two or more independent circuits. For example, a first circuit powered by a first voltage rail may be communicatively coupled to a second circuit powered by a second voltage rail. It may be necessary that the first voltage rail properly power the first circuit before the second circuit uses an output of the first circuit as valid input for further processing.

Many times it is not possible to control a sequence of ramping voltage rails powering different circuits because the voltage rails are generated independent of each other. Because of this condition, it is possible that the second circuit in the above example is powered in advance of the first circuit. In such an instance, if the second circuit uses the output of the improperly powered first circuit, the second circuit will be processing invalid data.

In order to guarantee power sequencing between a first circuit (such as a driver circuit) and the second circuit (such as a controller circuit), traditional architectures have required use of a dedicated pin on both the controller and driver. As an example, a first circuit can include a dedicated output pin used only for the purpose of communicating whether or not a first voltage rail properly powers the first circuit. The second circuit can include a dedicated input pin, which is used only to receive the signal outputted by the first circuit from the output pin. Accordingly, via communications out the output pin of the first circuit to the input pin of the second circuit, the second circuit can be apprised of whether or not the first circuit is properly powered by a respective voltage rail. Such a configuration is undesirable because it requires use of two dedicated pins (that is, an output pin and an input pin) to support communications between the first circuit and the second circuit.

As an alternative, external monitor circuitry with respect to the first circuit can be configured to monitor the first voltage rail and drive a dedicated input pin of the second circuit to notify the second circuit when the voltage rail powering the first circuitry reaches an appropriate voltage level.

BRIEF DESCRIPTION

Conventional applications such as those as discussed above suffer from a number of deficiencies as mentioned. For example, both the first circuit and the second circuit as discussed above may be integrated circuits having a limited number of input/output pins. In such an instance, there may be no extra pins in a multi-chip configuration available to support notification to the second circuit when the first circuit has been properly powered by a voltage rail. Hence, according to conventional techniques, because no resources are available, it may not be possible to notify a second circuit of a condition in which the first circuit is not yet powered.

Embodiments herein include a unique way of communicating data from one circuit to another and controlling a sequence of activating functionality using fewer resources than required by conventional techniques.

More specifically, one embodiment herein includes a system in which activation of one or more downstream circuits depends on proper powering of one or more upstream circuits. An example system comprises first circuitry (such as a first integrated circuit device having a limited number of input/output pins) and second circuitry (such as a second integrated circuit device having a limited number of input/output pins). The second circuitry is communicatively coupled to receive communications over a communication link from the first circuitry. The first circuitry includes a monitor circuit. The monitor circuit monitors a voltage rail inputted to power the first circuitry. The monitor circuit controls transmission of communications over the communication link to the second circuitry depending upon a magnitude of the voltage rail.

In one embodiment, a voltage magnitude of the signal transmitted over the communication link to the second circuitry provides an indication whether or not the first circuitry is properly powered.

By further way of example embodiment, to control a sequence of circuit activation in a multi-circuit environment, the monitor circuit monitors a voltage rail inputted to power first circuitry. The monitor circuit initiates switching between transmitting a control signal (such as status information indicating that the first circuitry is not properly powered) and a data or information to signal (such as phase current information generated by the first circuitry) over a communication link from the first circuitry to second circuitry depending upon the magnitude of the voltage rail. For example, during conditions in which the magnitude of the voltage rail is detected as being below a threshold value, the monitor circuit prevents transmission of the data signal and transmits the under-voltage condition over the communication link to the second circuitry. Conversely, during conditions in which the magnitude of the voltage rail is detected as being above the threshold value, in lieu of communicating the under-voltage condition (status information indicating that the first circuitry is not properly powered), the monitor circuit initiates transmission of the data signal over the communication link to the second circuitry.

In one embodiment, a voltage magnitude of the signal indicates an amount of current delivered by a respective phase in a power supply to power a load. A magnitude of the signal indicates an amount of current delivered by a respective phase of the power supply. The magnitude of the data signal varies within a predefined voltage range depending upon the amount of current provided by the respective phase.

The monitor circuit produces the under-voltage signal (status information indicating that the first circuit is not properly powered) transmitted to the second circuit to be a value that falls outside of the predefined voltage range to indicate when the voltage rail inputted to power the first circuitry is below the threshold value.

Upon initial ramping of the voltage rail to power up of the first circuitry, when a magnitude of the voltage rail is below a threshold value (and that the first circuitry is not properly powered), the monitor circuit defaults to transmitting the control signal (status information indicating at the first circuitry is not properly powered) in lieu of the data signal over the communication link to indicate that the first voltage rail is below a threshold value.

Eventually, the voltage rail used to power the first circuitry exceeds the threshold value, indicating that the first circuitry is properly powered. After the monitor circuit detects that the magnitude of the first voltage rail to power the first circuit increases above the threshold value, the monitor circuit initiates switching to transmitting the data signal over the communication link in lieu of transmitting the control signal over the communication link.

Note that the system as described herein can include a second monitor disposed in the second circuitry. The second monitor circuitry monitors the communications received over the communication link. The second monitor circuitry disables one or more functions supported by the second circuitry until a voltage level of the communications received over the communication link is above a threshold value (or within the predefined range), indicating transmission of the data signal over the communication link. Transmission of the data signal (i.e., any signal having a respective voltage level falling within the predetermined range) over the communication link indicates that the magnitude of the first voltage rail is above the threshold value. In other words, according to embodiments herein, it is known that the voltage rail properly powers the first circuitry when the second monitor circuit receives a signal over the communication link having a magnitude above a respective threshold value.

As further discussed below, the power supply system according to embodiments herein can include one or more additional communication links between the first circuitry in the second circuitry. In one embodiment, a second communication link facilitates communication of a generated signal (such as a temperature signal) from the first circuitry to the second circuitry. During normal operation, the generated signal transmitted over the second communication link falls within a predetermined voltage range. In one embodiment, in lieu of transmitting the generated voltage within the predetermined voltage range, during a respective failure condition, the first circuitry pulls the voltage on the second communication link to a value outside of the predetermined voltage range. The control circuitry 640 monitors the voltage on the second communication link. In response to detecting a failure condition, such as that the voltage of the second communication link falls outside of the predetermined voltage range, the control circuitry 640 detects occurrence of the failure condition.

In accordance with further embodiments, based on the voltages received over the first communication link and the second communication link, the second circuitry 640 is able to determine the specific status of the first circuitry.

In accordance with yet further embodiments, the second circuitry can be configured to pull-up a respective voltage on the second communication link to notify the first circuitry to switch to a disable mode, during which a respective phase in power supply associated with the first circuitry is shut off (provides zero current to a respective load).

The embodiments as described herein are advantageous over conventional techniques. For example, the techniques as discussed herein use fewer resources than as use by conventional techniques to provide such functionality.

As discussed above, techniques herein are well suited for use in multi-circuit applications in which corresponding circuits are powered by different voltage rails. However, it should be noted that embodiments herein are not limited to use in such applications and that the techniques discussed herein are well suited for other applications as well.

Additionally, note that although each of the different features, techniques, configurations, etc., herein may be discussed in different places of this disclosure, it is intended, where appropriate, that each of the concepts can optionally be executed independent of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section and corresponding figures of the present disclosure as further discussed below.

Figure 1:
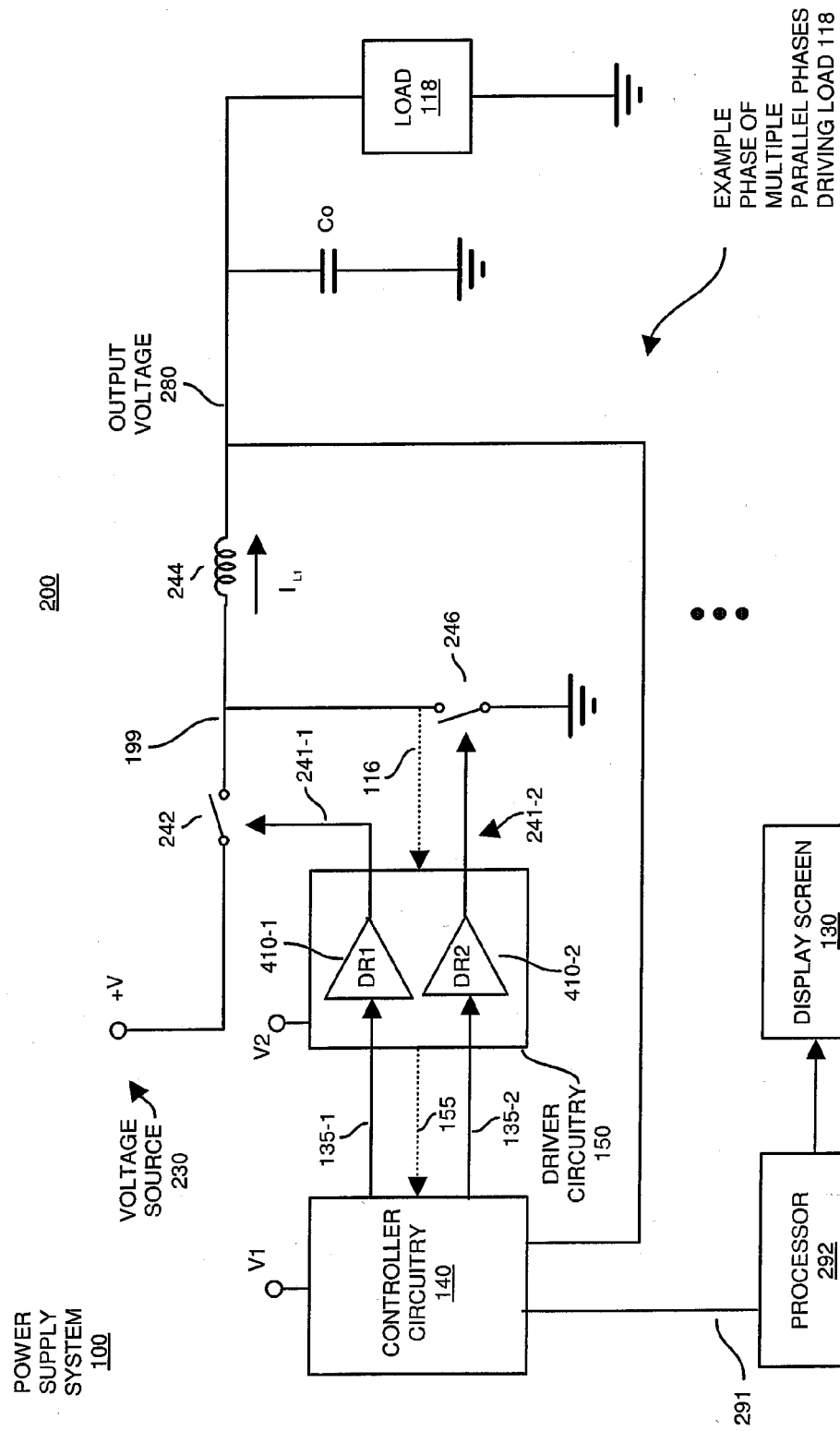
FIG. 1 is an example diagram illustrating power supply circuitry according to embodiments herein.

Note that the foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION AND FURTHER SUMMARY OF EMBODIMENTS

In accordance with embodiments herein, a system comprises first circuitry (such as a first integrated circuit device having a limited number of input/output pins) and second circuitry (such as a second integrated circuit device having a limited number of input output pins). The second circuitry is communicatively coupled to receive communications over a communication link from the first circuitry. In one embodiment, the first circuitry includes a monitor circuit. The monitor circuit monitors a voltage rail inputted to power the first circuitry. The monitor circuit initiates switching between transmitting a control signal (such as status information indicating whether the first circuitry is powered correctly) and a data signal over a communication link from the first circuitry to second circuitry depending upon the magnitude of the voltage rail. For example, when the first circuit is properly powered, the monitor circuit initiates transmission of the data signal over the communication link to the second circuitry instead of sending status information (control signal) indicating that the first circuitry is not properly powered.

FIG. 1 is a diagram illustrating functionality associated with an example power supply system according to embodiments herein.

In general, controller circuitry 140 produces control signals 135 (control signal 135-1, control signal 135-2, . . . ) to control the state of drivers DR1 and DR2 in driver circuitry 150. The driver DR1 controls a state of switch 242 (such as a control switch). The driver DR2 controls a state of switch 246 (such as asynchronous switch). Appropriate switching of switches 242 and 246 results in delivery of current from voltage source 230 through inductor 244 to produce output voltage 280. Output voltage 280 powers dynamic load 118.

By way of non-limiting example embodiment, the switch 242 can be a field effect transistor. In such an instance, based on control signal 135-1 produce by controller circuitry 140, the driver DR1 produces control signal 241-1 to drive a gate of the switch 242. The drain of switch 242 is electrically coupled to voltage source 230 (+V). The source of switch 242 is electrically coupled to common node 199.

The switch 246 also can be a field effect transistor. In such an instance, based on control signal 135-2 produced by control circuitry 140, the driver DR2 produces control signal 241-2 to drive gate of the switch 246. The drain of switch 246 is electrically coupled to node 199. The drain of switch 246 is electrically coupled to the ground reference.

Controller circuitry 140 receives feedback such as output voltage 280 to control a magnitude of the output voltage 280 within a desired range. Based on a magnitude of the output voltage (and potentially other feedback), the controller circuitry 140 adjusts the pulse widths associated with control signals 135.

As further shown, the driver circuitry 150 can receive feedback signal 116 such as a voltage of the drain of switch 246. In one embodiment, the feedback signal 116 represents or is used to determine the amount of current through inductive 244 delivered to the dynamic load 118.

Similar to the phase shown in FIG. 1, each of one or more other phases in power supply system 100 can include a respective independently operating high side switch and low side switch. The controller circuitry 140 can be configured to independently control switching of each of the phases. Thus, in certain embodiments, the power supply system 100 is a multi-phase power supply.

As shown in the example embodiment of FIG. 1, during operation, controller circuitry 140 generates control signal 135-1 to control respective high side switch circuitry 242. Controller circuitry 140 generates a control signal 135-2 to control low side switch circuitry 246.

When high side switch circuitry 242 is turned ON via controller circuitry 140 (while low side switch circuitry 246 is OFF), the current through inductor 244 increases via a temporary conductive path provided by high side switch circuitry 242 between voltage source 230 and inductor 244. When low side switch circuitry 246 is turned ON via controller circuitry 240 (while high side switch circuitry 242 is OFF), the current through inductor 244 decreases based on a temporary conductive path through the low side switch circuitry 246 between the inductor 244 and ground.

In one embodiment, the feedback signal 116 is a substantially saw-tooth waveform indicating an amount of current through the inductor 244. Each 5 mV of the feedback signal 116 represents 1 A (Ampere) of current passing through inductor 244. Thus, when the feedback signal 116 is 20 mV, the amount of current passing through the inductor is 4 A (Amperes); when the feedback signal 116 is −25 mV, the current passing through the inductor is −5 A; and so on.

Driver circuitry 150 conveys the information in feedback signal 116 in feedback signal 155 to control circuitry 140. This can include modifying the original feedback signal 116 as further discussed below prior to forwarding it over the communication link to the controller circuitry 140.

In one embodiment, controller circuitry 140 can include respective circuitry to control any number of phases, similar to the example phase shown in FIG. 1. Each phase can include high side switch circuitry and low side switch circuitry as previously discussed. To deactivate a respective phase, the controller circuitry 140 can set both high side switch circuitry and low side switch circuitry of the respective phase to an OFF state.

Via feedback (equivalent to feedback signal 116 and feedback 155) from each phase, the controller circuitry 140 is able to determine how much current is delivered by each phase to the dynamic load 118.

As shown, different voltages power controller circuitry 140 and driver circuitry 150. For example, voltage source V1 powers controller circuitry 140, voltage source V2 powers driver circuitry 150, and so on.

As previously discussed, it is possible that the controller circuitry 140 is properly powered prior to the driver circuitry 150 being properly powered. In other words, when the power supply system 100 is first switched to an ON state, voltage source V1 may power the driver circuitry 150 prior to the voltage source V2 powering control circuitry 140. In such an instance, the controller circuitry 140 would receive feedback signal 155 from driver circuitry 150 that is not yet properly powered.

As further discussed below, it is desirable for the control circuitry 140 to be notified of whether the driver circuitry 150 has been properly powered by voltage source V2.

Figure 2:
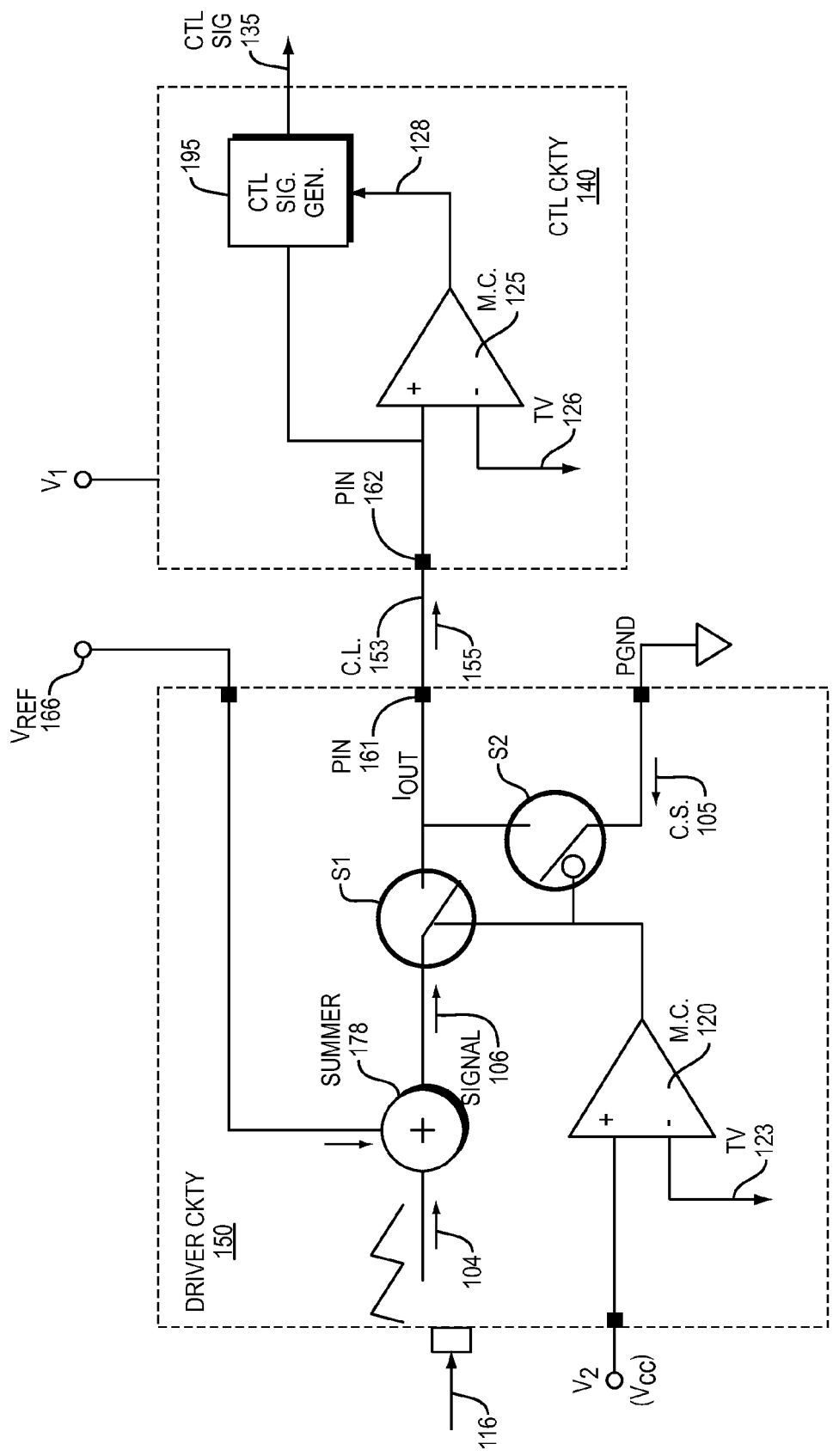
FIG. 2 is an example diagram illustrating a driver circuit and control circuit according to embodiments herein.

FIG. 2 is an example diagram illustrating a driver and control circuit according to embodiments herein.

Embodiments herein include a unique way of communicating data from one circuit to another and controlling a sequence of activating functionality using fewer resources than required by conventional techniques.

As shown in this example embodiment, driver circuitry 150 can be a first integrated circuit having a limited number of input/output pins. Controller circuitry 140 can be a second integrated circuit having a limited number of input/output pins. In a manner as previously discussed, the controller circuitry 140 is communicatively coupled to receive communications over a communication link (such as a trace on circuit board) from the driver circuitry 150.

As previously discussed, driver circuitry 150 receives feedback signal 116. As its name suggests, summer circuit 178 adds a DC offset of reference voltage 166 (such as 1.2 VDC with respect to PGND) to the feedback signal 116 to produce signal 106.

As further shown, the driver circuitry 150 can be configured to include monitor circuit 120. The monitor circuit 120 monitors a magnitude of voltage of voltage source V2 (a voltage rail) that the powers the driver circuitry 150. The monitor circuit 120 controls transmission of communications (such as signal 106, which is an offset rendition of feedback signal 116) over the communication link 150 to the controller circuitry 140 depending upon a magnitude of the voltage source, V2.

By further way of example embodiment, to control a sequence of circuit activation in this multi-circuit environment including driver circuitry 150 and controller circuitry 140, the monitor circuit 120 monitors voltage source V2. As shown, the monitor circuit 120 initiates switching between transmitting a control signal 105 (such as status information indicating that the driver circuitry 150 is not properly powered) and a signal 106 (such as current information indicating an amount of current through inductor 242) over the communication link 150 from driver circuitry 150 to the controller circuitry 140 depending upon the magnitude of the voltage rail, V2.

More specifically, during conditions in which the magnitude of the voltage rail V2 is detected as being below a threshold value 123, the monitor circuit 120 turns switch S1 to an off state to prevent transmission of the signal 106 over communication link 152 controller circuitry 140; monitor circuit 120 turns switch S2 to an on state to transmit the control signal 105 (such as a voltage equal to PGND) over the communication link 150 to the controller circuitry 140.

Conversely, during conditions in which the monitor circuit 120 detects that the magnitude of the voltage rail V2 is above threshold value 123, in lieu of transmitting the control signal 105 over communication link 150, the monitor circuit 120 initiates transmission of the signal 106 over the communication link 150 to the controller circuitry 140. In such an instance, to transmit the signal 106, the monitor circuit 120 controls switch S2 to an off state and controls switch S1 to an on state.

As previously discussed, the signal 106 can be configured to represent an amount of current delivered by a respective phase in a power supply to power a load 118. A magnitude of the signal 106 indicates an amount of current through inductor 242. The magnitude varies within a predefined voltage range depending upon the amount of current flow through the inductor 242. By way of non-limiting example embodiment, the voltage range (with respect to reference voltage 166) can be between −100 mV (corresponding to −50 A) and an appropriate maximum value such as 500 mV (corresponding to 100 A).

Control signal 105 can be voltage of −1.2 VDC with respect to the reference voltage 166, which falls outside of the range between −100 mV and 500 mV. Thus, the voltage of the control signal 105 falls outside of the predefined voltage range (−100 mV and 500 mV) to indicate when the voltage rail V2 is below the threshold value 123.

Figure 3:
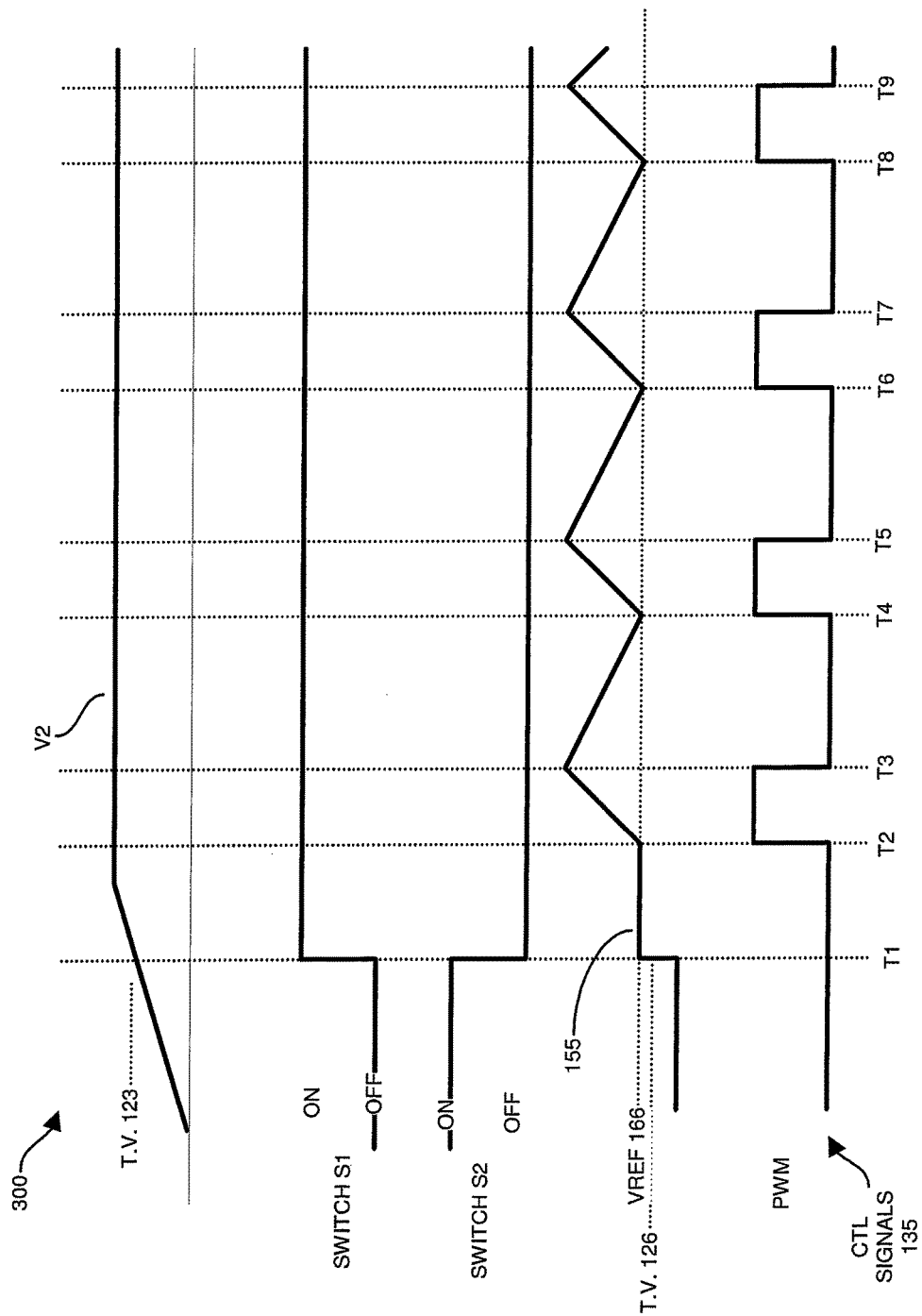
FIG. 3 is an example timing diagram illustrating circuit operation according to embodiments herein.

FIG. 3 is an example timing diagram illustrating circuit operation according to embodiments herein. In general, timing diagram 300 illustrates different voltage states of power supply system 100.

Upon initial ramping of the voltage rail V2 to power up of the driver circuitry 150, when a magnitude of the voltage rail V2 is below a threshold value 123 prior to time T1, via activation of switch S2 and deactivation of switch S1, the monitor circuit 120 defaults to transmitting the control signal 105 (such as PGND or −1.2 V with respect to reference voltage 166) in lieu of the signal 106 over the communication link 150 to indicate to control circuitry 140 that the first voltage rail V2 is below a threshold value 123.

Eventually, such as at or around time T1, the voltage rail V2 used to power the driver circuitry 150 exceeds the threshold value 123 (such as 3.75 VDC), indicating that the driver circuitry 150 becomes properly powered. When the monitor circuit 120 detects that the magnitude of the voltage rail V2 increases above the threshold value 123 at or around time T1, the monitor circuit 120 deactivates switch S2 and activates switch S1 to transmit the signal 106 over the communication link 155.

The power supply system 100 as described herein can include monitor circuit 125 disposed in controller circuitry 140. The monitor circuit 125 monitors the communications (feedback signal 155) received over the communication link 150. The monitor circuit 125 disables one or more functions supported by the control signal generator 195 in the controller circuitry 140 until a voltage level of the feedback signal 155 (communications) received over the communication link 150 is above a threshold value 126, indicating that the driver circuitry 150 transmits the signal 106 over communication link 150.

More specifically, prior to time T1, when the monitor circuit 125 detects that feedback signal 155 is set to PGND or −1.2 V with respect to voltage reference 166 (as a result of the monitor circuit 120 activating switch S2 and deactivating switch S1), the monitor circuit 125 generates signal 128 (such as a disable signal), to disable one or more functions associated with the control signal generator 195. This indicates to control signal generator 105 that the feedback signal 155 is invalid and not representative of current passing through the inductor 244. At such time, the control signal generator 195 knows that the received feedback signal 155 is not representative of current delivered by a respective phase.

After time T1, when the monitor circuit 125 detects that feedback signal 155 is above a threshold value 126 indicating that the feedback signal 155 falls between the reference voltage 166 and a corresponding maximum value, the monitor circuit 125 generates signal 128 (such as an enable signal), to enable one or more functions associated with the control signal generator 195. This enable signal indicates to control signal generator 105 that the feedback signal 155 is valid and representative of current passing through the inductor 244. In this instance, the control signal generator 105 uses the current delivery information received over communication link 150 to produce control signals 135.

Thus, the transmission of the signal 106 (i.e., any signal having a respective voltage level falling within the predetermined range such as between −100 mV and 500 mV) over the communication link 150 indicates that the magnitude of the voltage rail V2 used to power driver circuitry 150 is above the threshold value 123. In other words, according to embodiments herein, it is known that the voltage rail V2 properly powers the driver circuitry 150 when the monitor circuit 125 receives communications over the communication link 150 having a magnitude above threshold value 126.

As previously discussed, when the feedback signal 155 is within a specific predefined range or above threshold value 126, the feedback signal 155 from the driver circuitry 152 controller circuitry 140 represents the time varying inductor current $I_{L1}$ through a particular phase. The controller circuitry 140 uses this information for telemetry as well as to control the state of switches 242 in 246.

After time T1, the control signal generator 195 produces control signals 135. For example, between time T1 and T2, the control signal generator 195 produces control signal 135-1 to control switch 242 to an off state; the control signal generator 195 produces control signal 135-2 to control switch 246 to an off state.

Between time T2 and T3, the control signal generator 195 produces control signal 135-1 to control switch 242 to an on state; the control signal generator 195 produces control signal 135-2 to control switch 246 to an off state.

Between time T3 and T4, the control signal generator 195 produces control signal 135-1 to control switch 242 to an off state; the control signal generator 195 produces control signal 135-2 to control switch 246 to an on state.

Between time T4 and T5, the control signal generator 195 produces control signal 135-1 to control switch 242 to an on state; the control signal generator 195 produces control signal 135-2 to control switch 246 to an off state, and so on.

Referring again to FIG. 1, in accordance with still further embodiments, the controller circuitry 140 can be configured to initiate notification of a message on a display screen 130 of a computer system to indicate a status of powering driver circuitry 150. As an example, a malfunction may occur in which the driver circuitry 150 is never properly powered by a respective voltage rail V2. In such an instance, the monitor circuit 125 constantly receives feedback signal 155 set to PGND, indicating that the driver circuitry 150 is never powered properly. In response to detecting this condition, the controller circuitry 150 can be configured to notify processor 292 of the failure condition. Processor 292 initiates display of an appropriate notification on display screen 130. Accordingly, a respective user can be apprised when there is a failure associated with power supply system 100.

In accordance with further embodiments, the controller circuitry 140 can be configured to monitor the health of each of the phases via the feedback signal 155 received from each of the phases. In the event of a failure, one or more driver circuits of the phases may generate a respective feedback signal 155 indicating that the respective driver circuit is never properly powered. If desired, the controller circuitry 140 can be configured to communicate such a failure event to processor 292. For example, the controller circuitry 140 may detect that one out of six driver circuitries associated with respective to phases happens to fail. This means that one phase is not functioning properly. In a manner as previously discussed, the processor 292 can be configured to initiate display of an appropriate message on display screen 130 to notify the respective user of the failure.

As previously discussed, when the feedback signal 155 is within a specific predefined range or above threshold value 126, the feedback signal 155 from the driver circuitry 152 controller circuitry 140 represents the time varying inductor current $I_{L1}$ through a particular phase. Along with feedback indicating magnitude of the output voltage 280, the controller circuitry 140 uses this information to produce PWM control signals 135 to control the state of switches 242 and 246.

Referring again to FIGS. 2 and 3, in one embodiment, the voltage of the feedback signal 155 is common mode to a fixed reference voltage 166, Vref. Therefore, for no load/inductor currents (0.0 Amps), the RMS values of the will equal the reference voltage Vref. Furthermore, in one embodiment, the minimum monitored inductor current as indicated by the driver is around −30 A. At −30 Amps, using 5 mV/A as a gain factor, the magnitude of the feedback signal 155 would be 150 mV below the reference voltage 166, Vref. The concept behind communicating the driver under voltage through the TOUT pin 161 is that under normal operations, the voltage outputted from pin 161 would be more than 150 mV below voltage reference 166, Vref. The only time this would be possible would be if the driver supply voltage is below a vt and there is no impedance between Iout and Vref.

Therefore, forcing the IOUT pin 161 to ground (PGND) when the driver is in an under voltage condition is useful way to communicate a driver circuitry 150 under-voltage fault since the voltage PGND is outside the normal operational voltage range of the signal 106.

Figure 4:
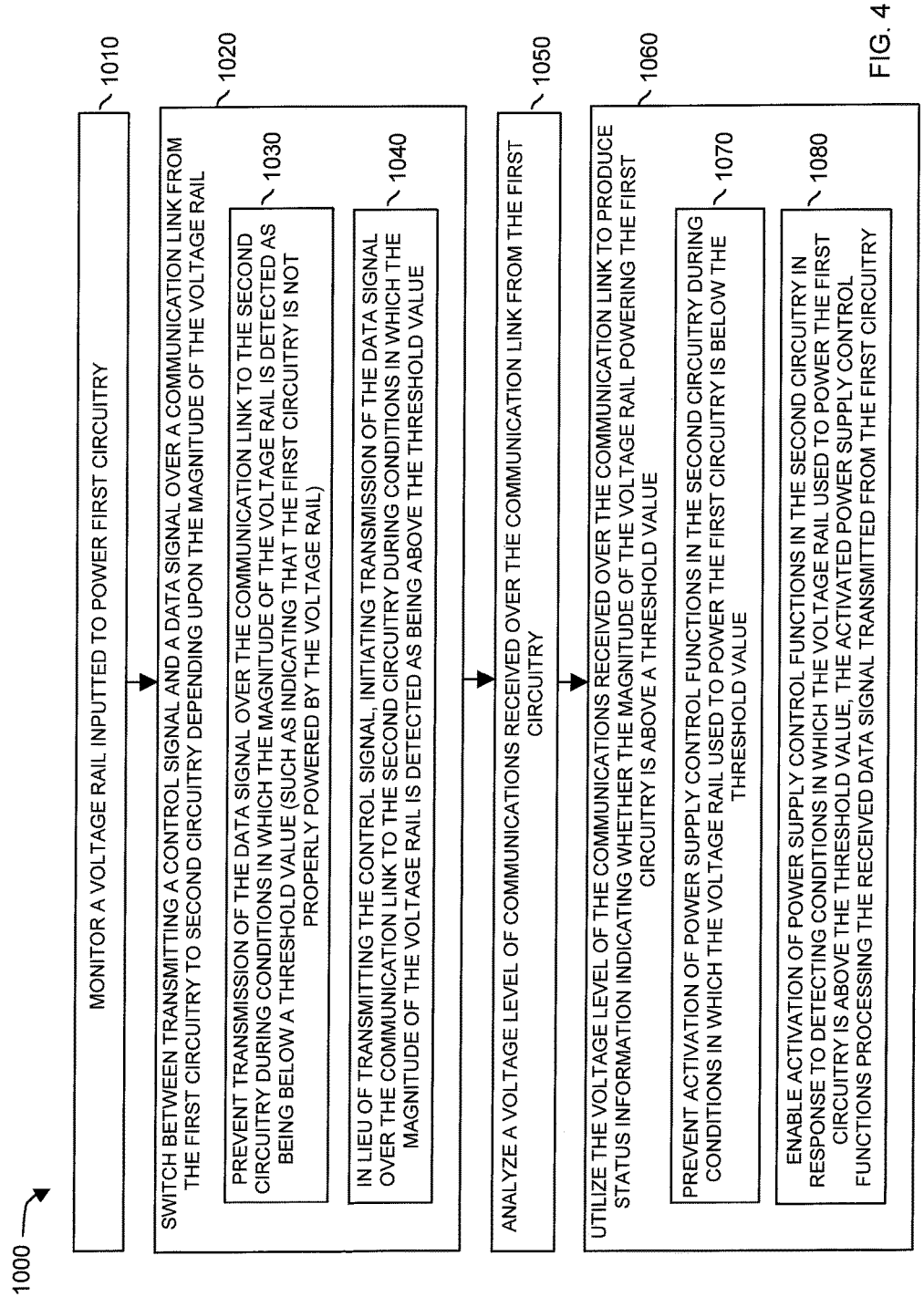
FIG. 4 is an example diagram of a flowchart of a method according to embodiments herein.

FIG. 4 is a flowchart 400 illustrating an example method of controlling a sequence of activating circuits in a multi-circuit environment according to embodiments herein. Note that there will be some overlap with respect to concepts discussed above for FIGS. 1 through 3.

In processing block 1010, the monitor circuit 120 monitors a voltage rail (V2) inputted to power first circuitry (such as driver circuitry 150).

In processing block 1020, the monitor circuit 120 switches between transmitting a control signal 105 (PGND) and a signal 106 over a communication link 150 depending upon the magnitude of the voltage rail (V2).

In sub-processing block 1030, the monitor circuit prevents transmission of the signal 106 over the communication link 150 to the second circuitry during conditions in which the magnitude of the voltage rail V2 is detected as being below a threshold value 123. In one embodiment, when voltage rail V2 is below the threshold value 123, the driver circuitry 150 is not properly powered.

In sub-processing block 1040, in lieu of transmitting the control signal 105, the monitor circuit 120 initiates transmission of the signal 106 over the communication link 150 to the second circuitry during conditions in which the magnitude of the voltage rail V2 is detected as being above the threshold value 123, indicating that the driver circuitry 150 is properly powered.

In processing block 1050, the monitor circuit 125 in the control circuitry 140 monitors (analyzes) a voltage level of communications 155 received over the communication link 150 from the first circuitry (driver circuitry 150).

In sub-processing block 1060, the monitor circuit 125 utilizes the voltage level of the communications 155 received over the communication link 150 to produce signal 128 (such as status or control information) indicating whether the magnitude of the voltage rail V2 powering the first circuitry (driver circuitry 150) is above a threshold value 123.

In sub-processing block 1070, the monitor circuit 125 prevents activation of one or more power supply control functions in the second circuitry (control circuitry 140) during conditions in which the voltage rail V2 used to power the first circuitry (driver circuitry 150) is detected as being below the threshold value 123 (as a result of the monitor circuit 125 detecting that the feedback signal 155 is below a threshold value 126).

In processing block 1080, the monitor circuit 125 produces signal 128 to enable activation of power supply control functions (as provided by control signal generator 195) in the second circuitry (control circuitry 140) in response to detecting conditions in which the voltage rail V2 used to power the first circuitry is above the threshold value 123 (as a result of the monitor circuit 125 detecting that feedback signal 155 is above threshold value 126). In one embodiment, the activated power supply control functions (as executed by control signal generator 195) process the received signal 106 transmitted from the driver circuitry 150 to produce control signals 135. As previously discussed, the control signals 135 (control signal 135-1 and control signal 135-2) control activation of a respective high-side switch circuitry 242 (control switch circuitry) and low side switch circuitry 246 (synchronous switch circuitry) in power supply system 100.

Figure 5:
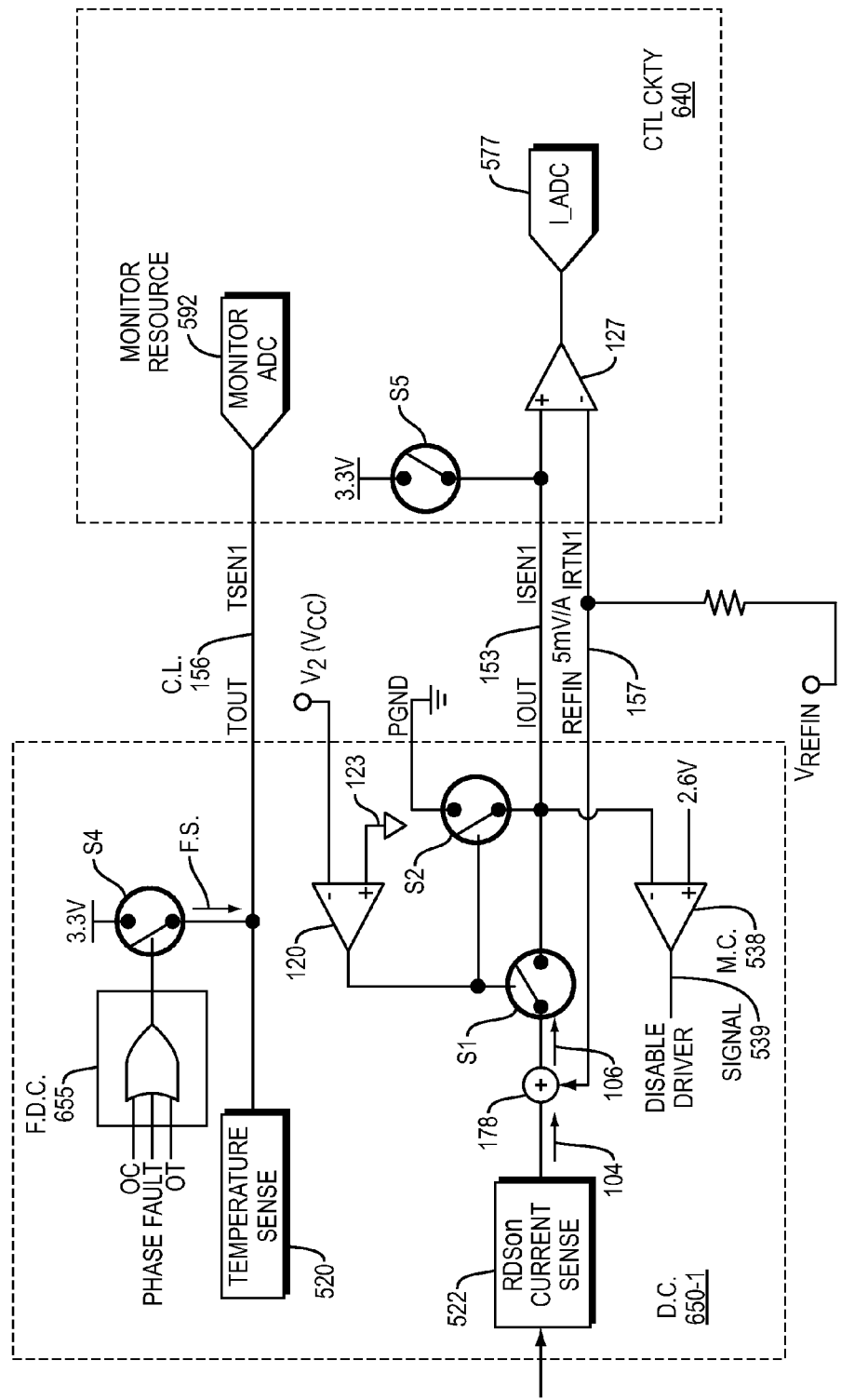
FIG. 5 is an example diagram illustrating a configuration of a driver circuit and control circuit according to embodiments herein.

FIG. 5 is an example diagram illustrating a driver circuitry and control circuitry according to embodiments herein. Note that reference will be made to prior FIGS.

As shown, driver circuitry 650-1 (such as a more specific or modified embodiment of driver circuitry 150) includes fault detection circuit 655. In general, fault detection circuit 655 monitors and provides notification of fault conditions associated with power supply system 100 to control circuitry 640 as further discussed below.

Fault Communication:

In one embodiment, the driver circuitry 650-1 detects occurrence of faults and communicates such faults to control circuitry 640 (such as a more specific embodiment of control circuitry 140) using a combination of IOUT and TOUT pins/signals conveyed over communication link 156 and communication link 153.

As explained above, the IOUT pin 161 and corresponding signal transmitted over communication link 153 provides an analog voltage proportional to the phase current at a gain such as 5 mV/Amp. In this example embodiment, the voltage of the IOUT pin produced by driver circuitry 650-1 and transmitted over communication link 153 (such as a trace on a printed circuit board) is common mode to a fixed reference voltage REFIN. Via signal generator 520, when switch S4 is set to an open state (during a non-fault condition), the TOUT pin/signal of driver circuitry 650-1 provides an analog voltage proportional to a parameter such as the operating temperature of driver circuitry 650-1.

In one embodiment, the TOUT pins/signal (such as a status signal) outputted from signal generator 520 (such as temperature sensor circuit) in driver circuitry 650-1 has a slope of 8 mV/° C., in which 0.6V corresponds to 0° C. In one embodiment, the temperature sensor 520 produces the corresponding temperature output signal to fall within a predetermined voltage range such as between 0.0 V and 1.7 V. When the corresponding monitor resource 592 detects the voltage on communication link 156 within this range, the control circuitry 640 knows that the signal currently transmitted on the communication link 156 is a specific type of signal such as a temperature sensing signal.

Figure 6:
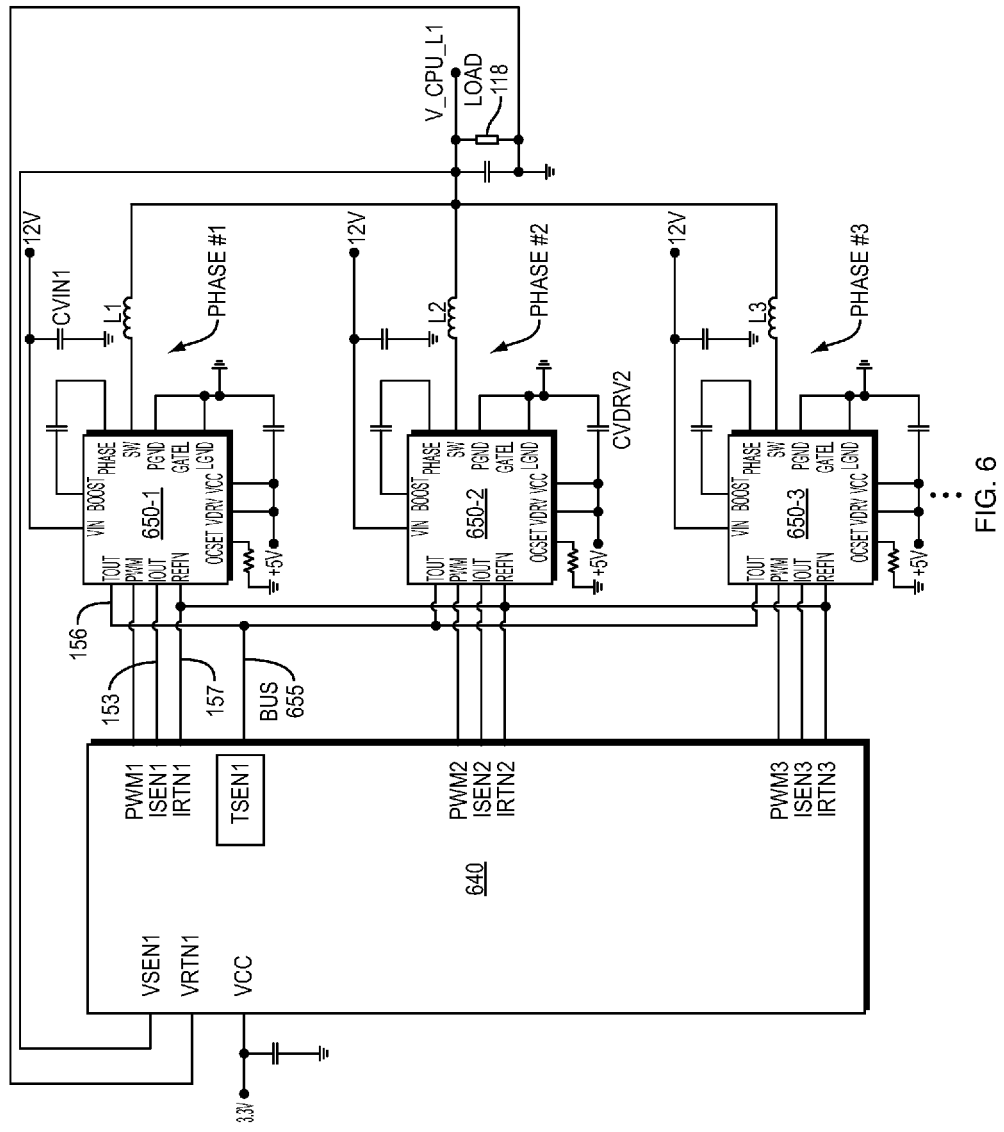
FIG. 6 is an example diagram illustrating connectivity between multiple driver circuits and a corresponding control circuit according to embodiments herein.

With further reference to FIG. 6, in a multi-phase power supply system, the TOUT pin of all the driver circuitries 650 (collectively, driver circuitry 650-1, driver circuitry 650-2, etc.) can be tied together to form a bus 655. In this example embodiment, the voltage received by the control circuitry 640 on the bus 655 represents the highest temperature of a corresponding driver circuitry in the system. In other words, the corresponding driver circuitry in phase that is of the highest temperature produces the output voltage conveyed on bus 655 to control circuitry 640. Control circuitry 640 includes a corresponding interface TSEN1 (such as monitor resource 592) to detect a temperature of the hottest phase amongst the multiple phases. Accordingly, via the corresponding interface TSEN1, the control circuitry 640 is able to detect a hottest drive circuitry (phase) amongst the multiple phases. The received signal received over communication link 156 indicates the hottest phase, but it does not indicate which particular one of the phases is hottest.

Referring again to FIG. 5, by using the combination of IOUT and TOUT pins, as well as the corresponding communication links 156 and 153 to convey respective generated signals to control circuitry 640, the driver circuitry 650-1 communicates the specific type of fault (such as OC, phase fault, OT, etc.) to the control circuitry 640. For example, as further discussed below, the signals transmitted over communication links 156 and 153 enable the control circuitry 650 to identify a specific phase that happens to be experiencing a fall condition.

More specifically, based on the communications over communication links 156 and 153, the control circuitry 640 can be configured to provide more detailed communication to the processor 292, thereby allowing it to take more intelligent decisions during system operation and also allow easier troubleshooting. The different types of faults communicated by the driver circuitry 650-1 are described in more detail below.

Phase Fault Condition Monitored by Fault Detection Circuit 655

"Phase fault" (inputted to fill you detection circuitry 655) is a failure condition associated with the driver circuitry 650-1 that occurs when a corresponding switch such as high side switch 242 controlled by driver circuitry 650-1 is damaged and creates a short circuit condition.

In one embodiment, the driver circuitry 650-1 detects this failure condition by monitoring the voltage at the switch node 199 (FIG. 1). As previously discussed, the drive circuitry 650-1 notifies control circuitry 640 of a corresponding phase fault failure via driving appropriate communication signals over communication link 156 and communication link 153.

As a more specific example, during a phase fault condition, the phase fault signal inputted to the fault detection circuitry 655 is set to a logic one. In response to detecting this condition, failure detection circuitry 655 activates switch S4 to an ON state. Activation of switch S4 causes transmission of 3.3 V (which falls outside of the predetermined voltage range of 0.0 and 1.7 V associated with the signal generator 520) on the TOUT signal to input TSEN1 (monitor resource 592) of the control circuitry 640. Monitor resource 592 monitors the signal outputted by the drive circuitry 650-1 over communication link 156. When the monitor's resource 592 receives a voltage of 3.3 V, because this value falls outside of the normal temperature voltage range between 0.0 V of 1.7 V of the signal generated by the signal generator 520, the control circuitry 640 knows that a fault condition occurred.

Note that in addition to setting the communication link 156 to 3.3 V in response to detecting the phase fault condition, the drive circuitry 650-1 shorts the IOUT signal to ground via activation of switch S2.

Setting of the TOUT signal to 3.3V (via activation of switch S4) as well as setting IOUT=0.0 volts indicates to the control circuitry 640 of the specific type of fault that has occurred. As shown in FIG. 6, because the control circuitry 640 receives the input over communication link 156 and the communication link 153 from driver circuitry 650-1, the control circuitry 640 is able to determine that the fault condition occurred with respect to phase #1.

Phase Over-Current Condition Monitored by Fault Detection Circuit 655

In accordance with further embodiments, as previously discussed, the drive circuitry 650-1 can be configured to receive a respective output signal 104 from signal generator 522. In one embodiment, the output signal 104 accurately represents an amount of current provided by phase #1 to the corresponding load 118. Subsequent to the voltage V2 (Vcc) being detected as greater than a threshold value 123, the monitor circuit 120 sets switch S1 to an ON state; the monitor circuit 120 additionally sets switch S1 to an ON state. In such an instance, the output signal 104 of the signal generator 522 passes as IOUT over communication link 153 to receiver 127 such as an amplifier. The receiver 127 produces an output signal inputted to analog-to-digital converter 577.

As further shown, communication link 157 is pulled up to voltage VREFIN. Summer circuit 178 adds the magnitude of the output signal 104 to VREFIN. The summer circuit 178 outputs the signal 106 (edition of signal 104 and VREFIN) as IOUT to a positive (+) terminal of receiver 127. The negative terminal of receiver 127 receives the voltage VREFIN. The receiver 127 produces an output to analog-to-digital converter 577. The analog-to-digital converter 577 converts the received signal from the receiver 127 to a value representative of the sensed current for phase #1.

In one embodiment, the driver circuitry 650-1 allows the user to program an over current (OC) threshold to protect the driver circuitry 650-1 from being damaged due to inductor saturation or poor current sharing amongst the multiple phases. The OC threshold is typically set much higher than the maximum operating phase current and closer to the current rating of the driver circuitry 650-1. When the operating phase current exceeds a maximum current threshold, the driver circuitry 650-1 will truncate the high-side pulses until the fault goes away. Under such OC scenarios, the driver circuitry 650-1 can also intelligently communicate an over current fault condition back to the controller circuit 640 by pulling up the TOUT pin/signal to 3.3V. In other words, when an overcurrent condition is detected by fault detection circuit 655, the fault detection circuit 655 switches to an ON state, connecting 3.3 V to the communication link 156.

Additionally, as previously discussed, upon detecting a 3.3V on the TOUT signal, the controller circuitry 640 is able to identify a corresponding driver circuitry failure. However, under this case, the controller circuitry 640 will also see a significantly higher voltage on the IOUT pin of the failed phase (programmable within the controller circuitry 640 depending upon the drive circuitry 650-1). The status of the voltage (indicating a high current condition) on communication link 153 enables the control circuitry 640 to determine the OC condition as a phase over current fault and also identify the phase at fault.

Thus, in response to detecting occurrence of an over current condition, the failure detection circuitry 655 pulls up a voltage on the communication link 156 to 3.3 V, overriding the output of signal generator 520. The control circuitry 640 is notified of a respective failure condition associated with driver circuitry 650-1. To determine the specific type of failure, the control circuitry 640 additionally monitors the communication link 153. During over current condition, the voltage on the communication link 153 is unusually high or outside of a normal operating range, indicating a current. In this manner, and based on detecting that the current signal received over communication link 153 indicates that phase #1 is above a threshold value such as 2.3 V (corresponding to a high current threshold value), the control circuitry 640 is able to detect that phase #1 experienced a respective overcurrent condition.

Over Temperature (OT) Fault Condition Monitored by Fault Detection Circuit 655

In accordance with yet further embodiments, the signal generator 520 in driver circuitry 650-1 produces an analog voltage proportional to the operating temperature of the driver circuitry 650-1. A valid signal from the signal generator 520 falls within a predetermined voltage range.

As previously discussed in FIG. 6, in a multi-phase system, all of the TOUT pins of different driver circuitry phases can be tied together. The control circuit 640 receives the signal on bus 655. When an OT fault occurs within the drive circuitry 650-1, the driver circuitry 650-1 is shut down (e.g., a respective pulse width modulation signal outputted from the control circuitry 640 to the drive circuitry 650-1 is set to tri-state in which both high side switch circuitry and low side switch circuitry associated with the base #1 are set to an off state). Additionally, in response to detecting the overtemperature condition (OT=1), note that the failure detection circuitry 655 closes switch S4, resulting in application of 3.3 V to communication link 156. Setting TOUT=3.3V allows the controller circuitry 640 to determine that there is a fault condition associated with driver circuitry 650-1. Under this condition, in one embodiment, the driver circuitry 650-1 that has the OT fault is configured to pull IOUT to REFIN voltage (this can include setting the voltage output of signal generator 520 to 0.0 V, during which the output of summer circuits 178 is then VREFIN).

As previously discussed, the control circuitry 640 includes a receiver 127 (such as a voltage monitor circuit) to detect the voltage conveyed from driver circuitry 650-1 to control circuitry 640 over communication link 153. Thus, when the drive circuitry 640 detects that the communication link 156 is pulled up to 3.3 V and also detecting that the communication link 153 is set to VREFIN, the drive circuitry 640 is informed that an over-temperature condition occurred with respect to the corresponding phase #1.

Driver Circuitry 640 "deep sleep" control via IOUT:

In accordance with further embodiments, the IOUT pin of the drive circuitry 650-1 can be configured to be a bi-directional pin. This allows the control circuitry 640 to set the drive circuitry 650-1 into a so-called "deep sleep" mode (zero quiescent current).

In one embodiment, the control circuitry 640 initiates disabling the drive circuitry 650-1 corresponding phase #1 by closing switch S5. This pulls up communication link 153 to a magnitude of 3.3 V. As further shown, drive circuitry 650-1 includes monitor circuit 538. Monitor circuit 538 monitors communication link 153 to detect a condition such as when the voltage on the communication link 153 is greater than a threshold reference voltage of 2.6 V. This corresponds to a shutdown command generated by the control circuitry 640 transmitted to drive circuitry 650-1.

In response to detecting that the voltage of the communication link 153 is above the threshold value of 2.6 V, the monitor circuit 538 generates control signal 539 indicating to disable drive circuitry 650-1 (e.g., set the PWM signal to a tri-state condition in which both the respective high side switch circuitry and the low side switch circuitry are set to an open condition). Alternatively, when the monitor circuit 538 detects that the voltage of the communication link 153 (such as a trace on a printed circuit board) is less than the threshold value of 2.6 V, the monitor circuit 538 generates control signal 539 to indicate an enable condition as opposed to be disabled condition. Thus, when the controller circuitry 640 determines that the drive circuitry 650-1 is not necessary to be "ON" (based on CPU command or load current), it can automatically force the shut-down of drive circuitry 650-1 by tri-stating the outputted PWM control signal and driving the communication link 153 (IOUT pin) to 3.3V. When driven to 3.3V on the IOUT, the drive circuitry 650-1 will go to an OFF-state, thereby reducing the quiescent power loss in the system.

To exit "deep sleep" mode, the controller circuitry 640 would release the control of IOUT pin (e.g., set switch S5 to an open state again), thereby allowing the driver circuitry 650-1 to switch out of the low power mode.

Summary of States:

Thus, the IOUT pin of the drive circuitry 650-1 (and corresponding voltage on communication link 153) allows proper sequencing of supply rails in a system thereby ensuring proper power up irrespective of how the different rails are powered in the system.

By using the IOUT and TOUT pins together (i.e., and voltages on communication links 153 in 156), the drive circuitry 650-1 can effectively communicate a specific fault to control circuitry 640. Based on the communicated fault, the control circuitry 640 is able to identify the failed phase (see table below) in a multi-phase voltage regulator, thereby improving the overall system intelligence and allowing easier troubleshooting in case of system failures.

TABLE 1

| Fault type | IOUT pin (link 153) | TOUT pin (link 156) |
|---|---|---|
| Vcc < threshold voltage 123 | 0 V | 0 V |
| Phase fault | 0 V | 3.3 V |
| Over current (OC) | VREFIN + (OC_thresh * 5 mV) | 3.3 V |
| Over temperature (OT) | VREFIN | 3.3 V |

As previously discussed, the control circuitry 640 can control a respective state of switch S5 to force the drive circuitry 650-1 into a "deep-sleep" (OFF) mode, thereby reducing the quiescent power loss in the system.

Figure 7:
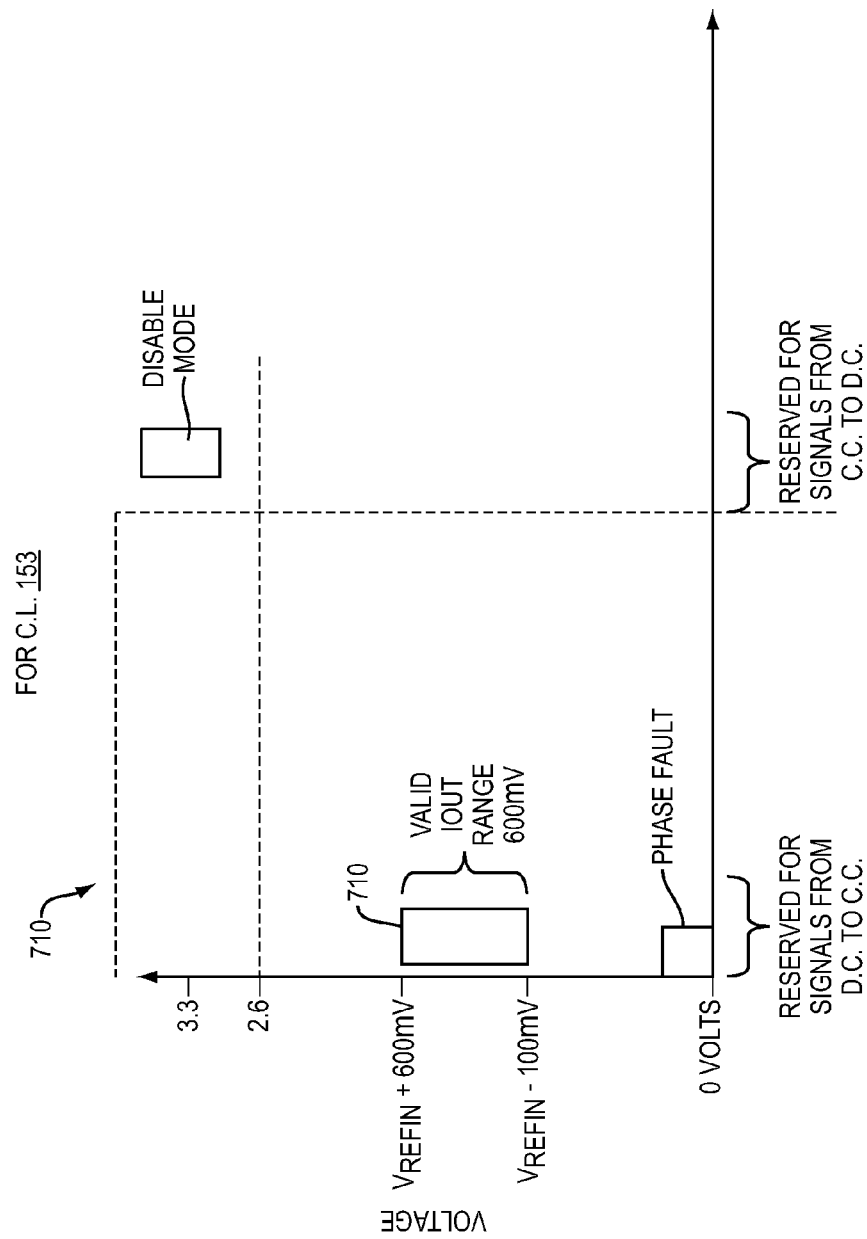
FIG. 7 is an example diagram illustrating voltage ranges reserved for communicating over a first communication link according to embodiments herein.

FIG. 7 is an example diagram illustrating a graph of voltage ranges dedicated to transmit signals according to embodiments herein. As shown, the left portion of graph 700 indicates voltage ranges of signals transmitted from the driver circuitry 650-1 to the control circuitry 640. The signal generator 522 generates a signal between −100 mV and 600 mV. The −100 to 600 mV signal generated by signal generator 522 is added to the VREFIN signal (such as a selected fixed value) via summer circuit 178 as previously discussed. The predetermined voltage range 710 between a value of 1.7 and 2.3 V (VREFIN−100 mV) to (VREFIN+600 mV). Note that these end values of range 710 can vary depending on the embodiment and selection of VREFIN. In one embodiment, the value of VREFIN is selected from the range between 1 and 2 volts. End values of range 710 vary accordingly. As previously discussed, range 710 represents a valid TOUT signal generated by signal generator 522 for transmission over communication link 153. As further shown, the drive circuitry 650-1 drives the output voltage of TOUT to 0.0 volts over communication link 153 to indicate a phase fault condition.

In the right portion of graph 700, the range of voltages above around 2.6 V is reserved for the control circuitry 640 to communicate 3.3 V in a reverse direction over communication link 153 to the monitor circuit 538, resulting in disabling of the driver circuitry 650-1.

Figure 8:
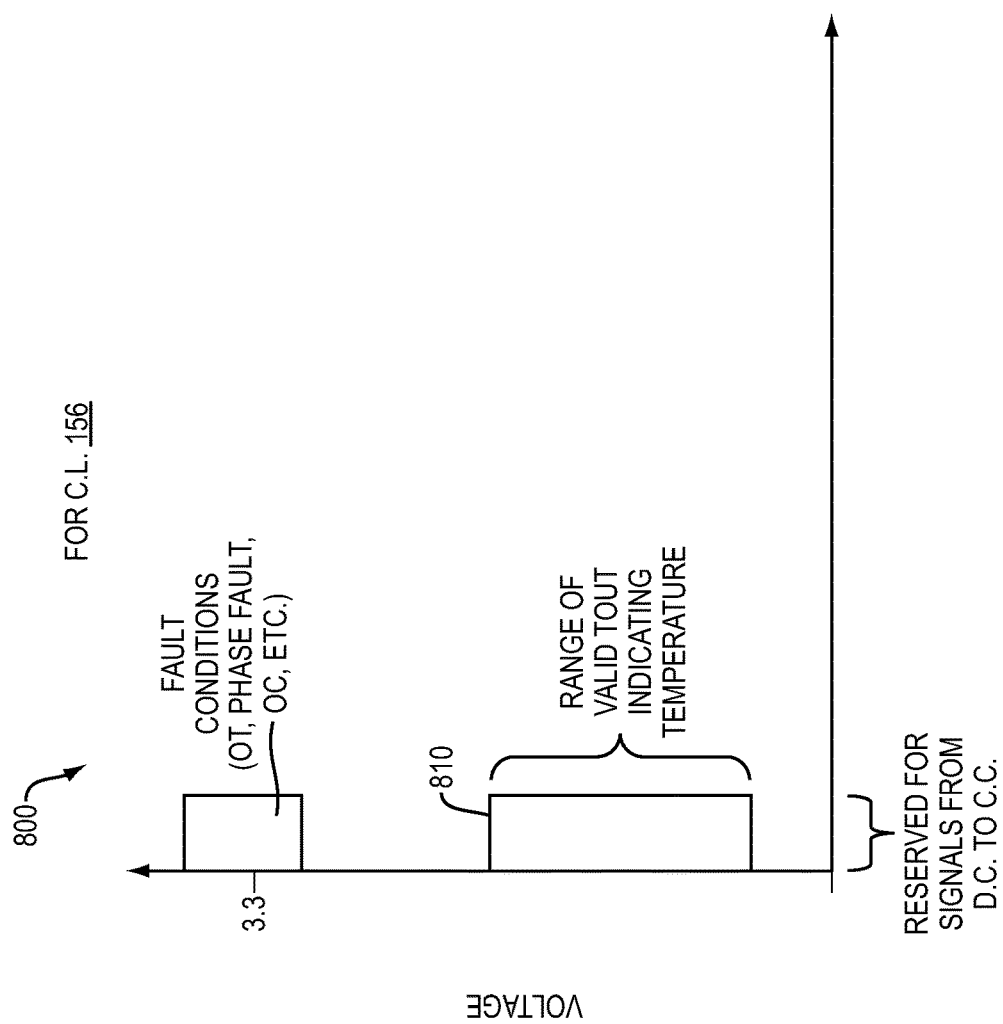
FIG. 8 is an example diagram illustrating voltage ranges reserved for communicating over a second communication link according to embodiments herein.

FIG. 8 is an example diagram illustrating a graph of voltage ranges dedicated to transmit signals from the driver circuitry to control circuitry according to embodiments herein. As shown, the predetermined voltage range 810 is reserved for the signal generator 520 to communicate a respective status of temperature over communication link 156 to monitor resource 192. In one embodiment, the range of voltage such as between 3.0 and 3.5 V is reserved for the fault the section circuit 655 to convey a corresponding voltage such as 3.3 V over communication link 156 to the monitor resource 592, indicating occurrence of a respective fault condition as previously discussed.

Note again that techniques herein are well suited for use in power supply applications and control systems. However, it should be noted that embodiments herein are not limited to use in such applications and that the techniques discussed herein are well suited for other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

We claim:

1. A system comprising:
    first circuitry;
    second circuitry, the second circuitry communicatively coupled to receive communications over a communication link from the first circuitry; and
    the first circuitry including a monitor circuit, the monitor circuit monitoring a voltage rail inputted to power the first circuitry, the monitor circuit controlling transmission of a feedback signal over the communication link to the second circuitry depending upon a magnitude of the voltage rail.

2. The system as in claim 1, wherein the monitor circuit initiates transmission of the feedback signal over the communication link to the second circuitry during conditions in which the magnitude of the voltage rail is detected as being above a threshold value.

3. The system as in claim 2, wherein the feedback signal represents an amount of current delivered by a respective phase in a power supply to power a load, a magnitude of the feedback signal varying within a predefined voltage range.

4. The system as in claim 3, wherein the monitor circuit prevents transmission of the feedback signal over the communication link to the second circuitry during conditions in which the magnitude of the voltage rail is detected as being below a threshold value.

5. The system as in claim 3, wherein the feedback signal is a received signal offset by a DC value; and
    wherein the monitor circuit transmits a reference voltage over the communication link in lieu of transmitting the feedback signal to indicate a condition in which the voltage rail inputted to power the first circuitry is below the threshold value, the reference voltage being outside of the predefined voltage range.

6. The system as in claim 1 further comprising:
    a first switch; and
    a second switch, the monitor circuit controlling a state of the first switch to convey the feedback signal over the communication link during conditions in which the first circuitry is properly powered by the voltage rail, the monitor circuit controlling a state of the second switch to convey a reference voltage in lieu of the feedback signal over the communication link during conditions in which the first circuitry is not properly powered by the voltage rail.

7. The system as in claim 1, wherein the voltage rail is a first voltage rail;
    wherein the monitor circuit, upon initial power up of the second circuitry, initially defaults to producing the feedback signal to a default level to indicate that the first voltage rail is below a threshold value until after a condition in which the monitor circuit detects that the magnitude of the first voltage rail increases above the threshold value; and
    wherein a voltage analyzer circuit in the second circuitry monitors the feedback signal received over the communication link, the voltage analyzer circuit disabling the second circuitry until detecting a condition in which the feedback signal received over the communication link indicates that the magnitude of the first voltage rail is above the threshold value.

8. The system as in claim 1, wherein the communication link is a first communication link, the system further comprising:

a second communication link between the first circuitry and the second circuitry, the second circuitry communicatively coupled to receive communications over the second communication link from the first circuitry; and the first circuitry including a signal generator circuit, the signal generator circuit configured to generate a status signal having a magnitude that falls within a predetermined voltage range;

the first circuitry further including a fault detection circuit, the fault detection circuit configured to generate a fault signal for transmission over the second communication link, the fault detection circuit initiating transmission of the fault signal over the second communication link to the second circuitry in response to detecting a fault condition.

9. The system as in claim 8, wherein the fault detection circuit generates the fault signal to be a magnitude that falls outside the predetermined voltage range to indicate occurrence of the fault condition; and wherein the second circuitry includes a monitor resource to detect when communications received over the second communication link fall outside of the predetermined voltage range.

10. The system as in claim 8, wherein the communication link is a first communication link, the system further comprising:

a second communication link between the first circuitry and the second circuitry, the second circuitry communicatively coupled to receive communications over the second communication link from the first circuitry;

the first circuitry including a signal generator circuit, the signal generator circuit configured to generate a status signal having a magnitude that falls within a predetermined voltage range; and wherein the monitor circuit initiates transmission of a voltage status signal over the second communication link in lieu of the status signal in response to detecting that the magnitude of the voltage rail is below a threshold value, a magnitude of the voltage status signal falling outside of the predetermined voltage range.

11. The system as in claim 10, wherein the second circuitry is configured to identify which one of multiple phases of a power supply that fails based on communications received over both the first communication link and the second communication link.

12. The system as in claim 1, wherein the feedback signal is a voltage representative of an amount of current delivered to power a load.

13. The system as in claim 12, wherein the magnitude of the feedback signal transmitted over communication link varies within a predefined voltage range.

14. The system as in claim 1, wherein the first circuitry includes a switch to electrically couple a circuit producing the feedback signal to the communication link depending on the magnitude of the voltage rail.

15. The system as in claim 14, wherein the first circuitry includes driver circuitry operable to control the switch to an ON state in response to detecting that the magnitude of the voltage rail is above a threshold value.

16. The system as in claim 14, wherein the first circuitry includes driver circuitry operable to control the switch to an OFF state in response to detecting that the magnitude of the voltage rail is below the threshold value.

17. The system as in claim 1, wherein the second circuitry is operable to control operation of power supply circuitry depending on a magnitude of the feedback signal.

18. The system as in claim 17, wherein the power supply circuitry controlled by the second circuitry includes high side switch circuitry and low side switch circuitry of a switching power supply; and wherein the second circuitry is operable to control states of the high side switch circuitry and the low side switch circuitry depending on the magnitude of the feedback signal.

19. The system as in claim 1, wherein the first circuitry is operable to convey a default voltage signal over the communication link in lieu of transmitting the feedback signal over the communication link in response to a condition in which the magnitude of the voltage rail is below a threshold value.

20. The system as in claim 19, wherein the default voltage signal is set to a magnitude outside of an operational range of the feedback signal to indicate that the voltage rail is below the threshold value.

21. The system as in claim 1, wherein first circuitry is operable to communicate multiple signals over the communication link at different times, the multiple signals including the feedback signal and a status signal associated with the voltage rail.

22. The system as in claim 1, wherein the first circuitry includes switch driver circuitry to drive multiple switches of a switching power supply.

23. A system comprising:

first circuitry;

second circuitry, the second circuitry communicatively coupled to receive communications over a communication link from the first circuitry; and the first circuitry including a monitor circuit, the monitor circuit monitoring a voltage rail inputted to power the first circuitry, the monitor circuit controlling transmission of communications over the communication link to the second circuitry depending upon a magnitude of the voltage rail; and wherein the second circuitry includes a voltage analyzer circuit to analyze a voltage level of the communications received over the communication link from the first circuitry, the voltage analyzer circuit utilizing the voltage level of the communications received over the communication link to produce status information indicating whether the magnitude of the voltage rail is above a threshold value.

24. The system as in claim 23, wherein the second circuitry includes a notification manager, the notification manager initiating notification of a message on a display screen to indicate a status of powering the first circuitry with the voltage rail.

25. The system as in claim 23, wherein the voltage analyzer circuit prevents activation of power supply control functions in the second circuitry in response to detecting conditions in which the voltage rail used to power the first circuitry is below the threshold value.

26. The system as in claim 25, wherein the voltage analyzer circuit enables activation of the power supply control functions in the second circuitry in response to detecting conditions in which the voltage rail used to power the first circuitry is above the threshold value.

27. A system comprising:

first circuitry;

second circuitry, the second circuitry communicatively coupled to receive communications over a communication link from the first circuitry; and the first circuitry including a monitor circuit, the monitor circuit monitoring a voltage rail inputted to power the first circuitry, the monitor circuit controlling transmission of communications over the communication link to the second circuitry depending upon a magnitude of the voltage rail; and wherein the second circuitry includes a control signal generator, the control signal generator configured to generate a control signal for transmission over the communication link to a receiver circuit in the first circuitry.

28. The system as in claim 27, wherein the first circuitry generates the communications over the communication link to the second circuitry to be within a predetermined voltage range; and wherein the control signal generator communicating from the second circuitry to the first circuitry generates a magnitude of the control signal transmitted over the communication link to be outside of the predetermined voltage range.

29. The system as in claim 28, wherein the first circuitry is switch driver circuitry disposed in a switching power supply; and wherein the control signal generator generates the control signal to deactivate the switch driver circuitry, the receiver circuit in the first circuitry deactivating the switch driver circuitry in response to detecting that the magnitude of the control signal falls outside of the predetermined voltage range.

* * * * *